US009818605B2

(12) United States Patent
Yan et al.

(10) Patent No.: US 9,818,605 B2
(45) Date of Patent: Nov. 14, 2017

(54) OXIDE TFT, PREPARATION METHOD THEREOF, ARRAY SUBSTRATE, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Changjiang Yan, Beijing (CN); Tiansheng Li, Beijing (CN); Shaoying Xu, Beijing (CN); Zhenyu Xie, Beijing (CN); Xu Chen, Beijing (CN)

(73) Assignees: BOE TECHNOLOGY GROUP CO., LTD., Beijing (CN); BEJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 6 days.

(21) Appl. No.: 14/387,390

(22) PCT Filed: Jul. 2, 2013

(86) PCT No.: PCT/CN2013/078705
§ 371 (c)(1),
(2) Date: Sep. 23, 2014

(87) PCT Pub. No.: WO2014/131258
PCT Pub. Date: Sep. 4, 2014

(65) Prior Publication Data

US 2015/0053967 A1 Feb. 26, 2015

(30) Foreign Application Priority Data

Mar. 1, 2013 (CN) .......................... 2013 1 0065383

(51) Int. Cl.
*H01L 21/00* (2006.01)
*H01L 21/84* (2006.01)
(Continued)

(52) U.S. Cl.
CPC .. *H01L 21/02554* (2013.01); *H01L 21/02472* (2013.01); *H01L 21/02483* (2013.01);
(Continued)

(58) Field of Classification Search
CPC ......... H01L 21/02554; H01L 21/02472; H01L 21/02483; H01L 21/02565; H01L 21/02617; H01L 29/66969
(Continued)

(56) References Cited

U.S. PATENT DOCUMENTS

2008/0067508 A1 3/2008 Endo et al.
2009/0045397 A1 2/2009 Iwasaki
(Continued)

FOREIGN PATENT DOCUMENTS

CN 101258607 A 9/2008
CN 101661952 A 3/2010
(Continued)

OTHER PUBLICATIONS

International Preliminary Report on Patentability Appln. No. PCT/CN2013/078705; dated Sep. 1, 2015.
(Continued)

*Primary Examiner* — Robert Huber
(74) *Attorney, Agent, or Firm* — Ladas & Parry LLP

(57) ABSTRACT

An Oxide TFT, a preparation method thereof, an array substrate and a display device are described. The method includes forming a gate electrode, a gate insulating layer, a channel layer, a barrier layer, as well as a source electrode and a drain electrode on a substrate; the channel layer is formed by depositing an amorphous oxide semiconductor
(Continued)

film in a first mixed gas containing $H_2$, Ar and $O_2$. By depositing a channel layer in a first mixed gas containing $H_2$, Ar and $O_2$, the hysteresis phenomenon of the TFT can be mitigated effectively to improve the display quality of the display panel.

15 Claims, 4 Drawing Sheets

(51) Int. Cl.

| | |
|---|---|
| ***H01L 21/02*** | (2006.01) |
| ***H01L 27/12*** | (2006.01) |
| ***H01L 29/66*** | (2006.01) |
| ***H01L 29/786*** | (2006.01) |

(52) U.S. Cl.
CPC .. *H01L 21/02565* (2013.01); *H01L 21/02617* (2013.01); *H01L 27/1225* (2013.01); *H01L 29/66969* (2013.01); *H01L 29/78693* (2013.01)

(58) Field of Classification Search
USPC ..... 257/53, E21.462, E21.463; 438/104, 151
See application file for complete search history.

(56) References Cited

U.S. PATENT DOCUMENTS

| | | | | |
|---|---|---|---|---|
| 2010/0279462 | A1 | 11/2010 | Iwasaki | |
| 2012/0156835 | A1 | 6/2012 | Isa et al. | |
| 2013/0207106 | A1 | 8/2013 | Hayashi et al. | |
| 2014/0054579 | A1* | 2/2014 | Kim ...................... | H01L 29/786<br>257/43 |

FOREIGN PATENT DOCUMENTS

| | | | |
|---|---|---|---|
| CN | 102157562 | A | 8/2011 |
| CN | 102237411 | A | 11/2011 |
| CN | 102651317 | A | 8/2012 |
| EP | 2787527 | A1 | 10/2014 |
| KR | 20110083973 | A | 7/2011 |

OTHER PUBLICATIONS

First Chinese Office Action dated Mar. 24, 2016; Appln. No. 201310065383.6.

* cited by examiner

OXIDE TFT, PREPARATION METHOD THEREOF, ARRAY SUBSTRATE, AND DISPLAY DEVICE

TECHNICAL FILED

Embodiments of the present invention relate to an oxide thin film transistor, a preparation method thereof, an array substrate, and a display device.

BACKGROUND

At present, a channel layer of an oxide thin film transistor (TFT) is formed by using an amorphous metal oxide semiconductor (MOS). The Oxide TFT mainly involves ZnO-based semiconductor TFT, e.g., Indium Gallium Zinc Oxide (IGZO) semiconductor, and has attracted considerable attentions from liquid crystal industries due to its excellent performances such as high mobility, low sub-threshold value, low leakage current, low temperature manufacturability, and so on. However, the channel layer of the Oxide TFT in existing technology still involves several problems to be solved.

In an existing technology, the channel layer of an Oxide TFT is usually deposited in an atmosphere of Ar gas and $O_2$ gas, which may result in defects of valence state V[O]. Such defects will capture a large number of carriers, and finally lead to a phenomenon like hysteresis, which influences the switching characteristic of the Oxide TFT and thus the quality of a display panel.

FIG. 1 is a schematic view illustrating a structure of an Oxide TFT array substrate in the existing technology. As shown in FIG. 1, the Oxide TFT array substrate comprises a gate electrode 2, a gate insulating layer 3, a channel layer (also referred to as an active layer) 4, a barrier layer 5, a source electrode 6*a*, a drain electrode 6*b*, a passivation layer 7 and a pixel electrode 8, which are disposed on a substrate 1; the channel layer 4 is formed by using a metal oxide material such as IGZO. In the existing technology, generally, the source and the drain electrodes are prepared by using a metal or a metal oxide such as Al, Mo, Ti and Indium Oxide. The channel layer of such kind of Oxide TFT has a valence band with different energy level from that of metal, thereby generating a certain potential barrier, which influences the migration rate of carriers. Therefore, the electrical characteristic of the Oxide TFT is always affected by carriers in the channel layer, and an interface between the source electrode, the drain electrode and the channel layer has relatively larger contact resistance, so the hysteresis phenomenon is notable.

SUMMARY

An embodiment of the present invention provides a preparation method of Oxide TFT, comprising: forming a gate electrode, a gate insulating layer, a channel layer, a source electrode and a drain electrode on a substrate; the channel layer is formed by depositing an amorphous oxide semiconductor film in a first mixed gas containing H2, Ar and O2.

Another embodiment of the present invention provides an Oxide TFT, comprising a gate electrode, a gate insulating layer, a channel layer, a source electrode and a drain electrode; the channel layer is formed by depositing an amorphous oxide semiconductor film in a mixed gas containing H2, Ar and O2; the source electrode and the drain electrode are formed by using an amorphous oxide material appearing a conductor characteristic.

Another embodiment of the present invention provides an array substrate comprising the above-mentioned Oxide TFT.

Another embodiment of the present invention provides a display device comprising the above-mentioned array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

1—Substrate; 2—Gate Electrode; 3—Gate Insulating Layer; 4—Channel Layer; 5—Barrier Layer; 6*a*/6*a*'—Source Electrode; 6*b*/6*b*'—Drain Electrode; 7—Passivation Layer; 8—Pixel Electrode.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Embodiments of the present invention are based on the concept that a certain amount of $H_2$ is introduced in an atmosphere of Ar and $O_2$ to form a first mixed gas when depositing a channel layer, so as to convert the defect state V[O], in an amorphous oxide semiconductor used as the channel layer, to the state [OH], thereby mitigating the hysteresis phenomenon resulted by the defects which capture the carriers in the channel layer.

Further, embodiments of the present invention further comprise depositing an amorphous oxide film in a second mixed gas containing $O_2$, so that the amorphous oxide film will present an electric characteristic of conductor, to form a source electrode and a drain electrode.

In embodiments of the present invention, for example, the first mixed gas contains $H_2$, Ar and $O_2$; the second mixed gas contains $H_2$ and Ar.

Embodiments of the present invention are not only applicable for a bottom gate thin film transistor (bottom-gate TFT) but also applicable for a top gate thin film transistor (top-gate TFT). Hereinafter the present invention is described in details with a bottom-gate TFT by way of example, in combination with appended drawings and illustrative embodiments.

Figure 1:
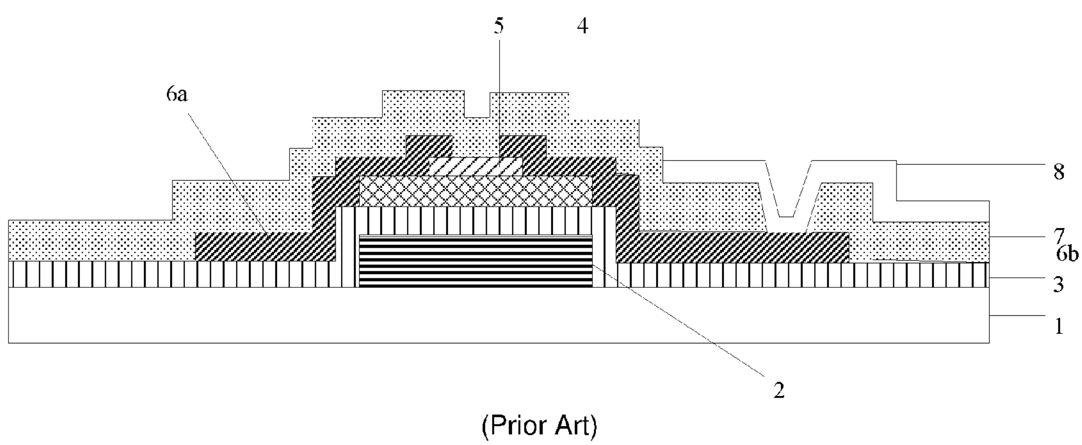
FIG. 1 is a schematic view illustrating a structure of an Oxide TFT array substrate in an existing technology.
Figure 2:
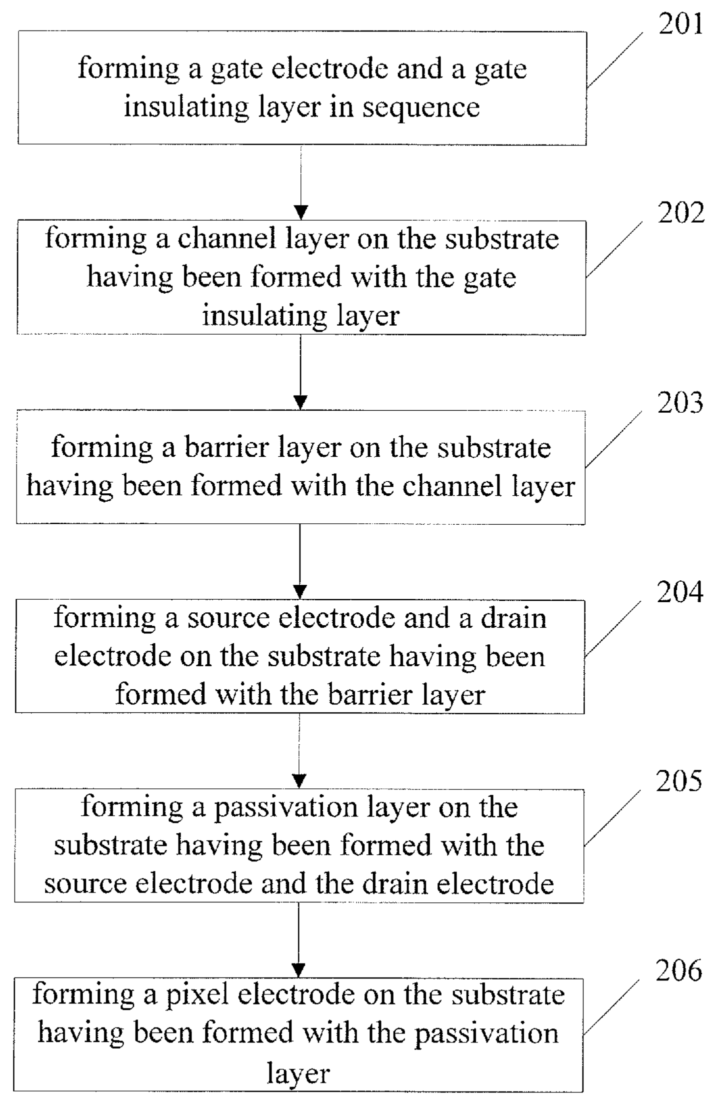
FIG. 2 is a flow chart illustrating a preparation method of Oxide TFT as provided by an embodiment of the present invention.

FIG. 2 is a flow chart illustrating a preparation method of Oxide TFT as provided by an embodiment of the present invention. As shown in FIG. 2, the method flow comprises steps as below.

Step S201, forming a gate electrode and a gate insulating layer in sequence.

Figure 3:
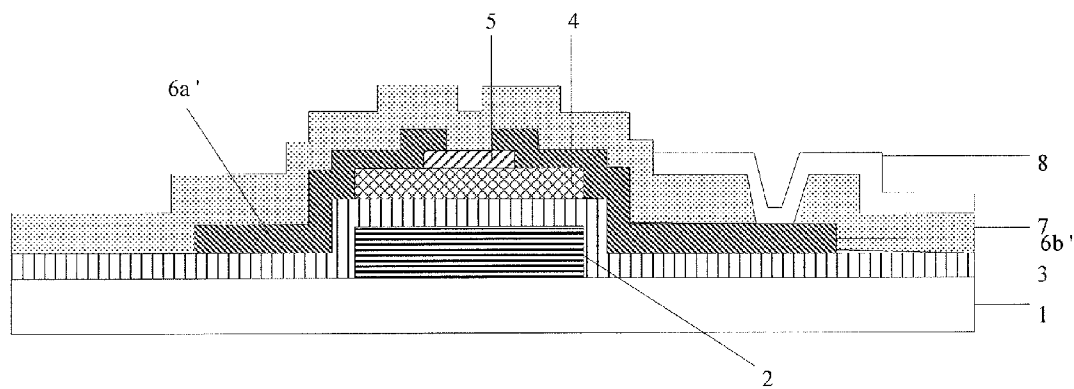
FIG. 3 is a schematic view illustrating a structure of an Oxide TFT as provided by an embodiment of the present invention.

In embodiments of the present invention, a gate layer film is formed on a substrate I and is patterned to form a gate electrode 2. Herein the gate electrode can be made from a metal material such as Al, Cu, Mo or the like by utilizing a wet etching process. Patterning processes known in an existing technology can be used in this step, thus no further details will be given herein. The structure as formed is shown in FIG. 3. A gate line pad (not shown) can be formed along with the formation of the gate electrode; or, a common electrode or a common electrode line and so on (not shown) can also be formed along with the formation of the gate electrodes.

Hereinafter, a gate insulating material is applied onto the substrate having been formed with the gate electrode 2, and a gate insulating layer 3 can be formed by utilizing a process known in an existing technology. Herein, the gate insulating layer 3 may be of Silicon Nitride ($SiN_x$), Silicon Oxide ($SiO_x$), Hafnium Oxide ($HfO_x$) or Aluminum Oxide ($AlO_x$), or may be a multi-layered lamination film formed of at least two of these materials. A thickness of the gate insulating layer 3 is usually controlled within a range from 100 nm to 500 nm, preferably from 300 nm to 400 nm, and a transmissivity thereof is controlled to be over 85%.

In addition, the gate insulating layer 3 can also be formed into an insulating layer film of 300 nm-500 nm, for example, from a material such as Aluminum Oxide ($Al_2O_3$), by utilizing physical sputtering deposition.

Step S202, forming a channel layer on the substrate having been formed with the gate insulating layer.

In embodiments of the present invention, an amorphous oxide semiconductor film is deposited in a first mixed gas containing $H_2$; the amorphous oxide semiconductor film may be, for example, Indium Gallium Zinc Oxide (IGZO) semiconductor film, Indium Tin Oxide (InSnO) semiconductor film or Indium Gallium Tin Oxide (InGaSnO) semiconductor film, although the present invention is not limited thereto. For example, in embodiments of the present invention, the amorphous oxide semiconductor film is an IGZO film, and the channel layer 4 is formed by a patterning process comprising wet etching.

Herein, the first mixed gas contains Ar, $O_2$ and $H_2$. In embodiments of the present invention, an amorphous oxide semiconductor film is deposited in an atmosphere (Ar and $O_2$) containing $H_2$, by introducing a certain amount of $H_2$ into the atmosphere of Ar and $O_2$ that are at a ratio of 9:1~2:1, for example. In this way, the defect states in the amorphous oxide semiconductor film can be reduced; that is, the defect state V[O] in the amorphous oxide semiconductor will be converted into the state [OH], reducing the possibility for the carriers to be captured by the defects and correspondingly mitigating the hysteresis phenomenon.

Characteristics of an Oxide TFT are determined by the trap density at the interface and the quantity of deep level state. As compared to Ar gas or the combination gas of Ar and $O_2$ used in the existing technology, the mixed gas of Ar and $H_2$ used in embodiments of the present invention can reduce the trap density at the interface and the quantity of deep level state, thus can relatively improve the switching characteristic of the Oxide TFT, because the deep level state V[O] can be converted into the relatively shallow level state [OH] which reduces a possibility for the carriers to be captured by the defects, and the transition phase from an amorphous film to a crystalline film can also provide good contact characteristics which correspondingly mitigates the hysteresis phenomenon.

Figure 5:
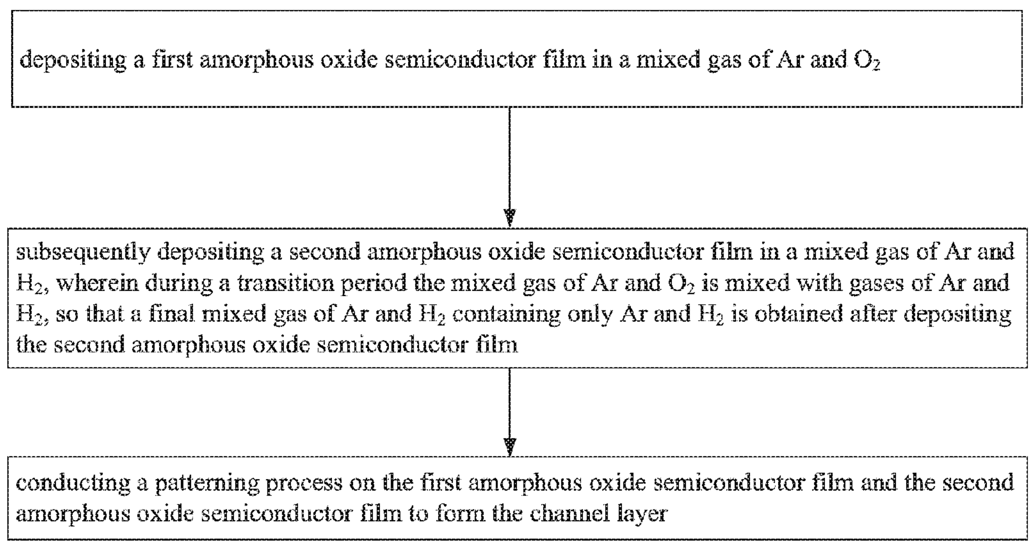
FIG. 5 is a flow chart illustrating a preparation method of a channel layer as provided by an embodiment of the present invention.

Hereinafter, this step is described in details with IGZO film by way of example with respect to FIG. 5.

First of all, in an atmosphere of Ar and $O_2$, a first amorphous oxide semiconductor (IGZO) film is deposited with a thickness of about 50~80 nm. In embodiments of the present invention, Ar and $O_2$ are at a ratio of 15:1~20:1, for example, 19:1 in content. Herein, it's preferred to contain more Ar than $O_2$ in the mixed gas, because a conductor film is prone to be formed if the amount of $O_2$ is dominating; generally, the flow rate of $O_2$ is set as 1~3 sccm. Of course, because an amorphous metal oxide semiconductor is formed, there will be certain defects in the interior of the resultant product.

Then the gas as introduced is adjusted to contain Ar and $H_2$ at a ratio of 9:1~2:1, for example, 9:1, and subsequently a second amorphous oxide semiconductor (IGZO) film (i.e., an amorphous oxide transitional layer) is deposited with a thickness of about 10~20 nm under such atmosphere. In this way, the mixed gas experiences quick transition in a short time period, that is, the original mixed gas of Ar and $O_2$ will be mixed with Ar and $H_2$ to a small extent, which causes the reaction of $3O_2+2H_2=2[O]+4[OH]$ under high temperature, so that the amount of [O] outside the IGZO film is larger than that of the internal [O], which makes the internal [O] of the IGZO film difficult to escape.

Afterwards, the mixed gas contains Ar and $H_2$ only, and at this time Ar will be combined with a deep-level defect state [O] in the interior of the IGZO film and thus convert it into the state [OH]. Since the state [O] belongs to a deep-level defect state, while the state [OH] is a shallow-level defect state which requires relatively shorter time to capture and release the carriers, the defect trap density at the interface and the quantity of deep level state is reduced.

Finally, a patterning process is conducted on the first amorphous oxide semiconductor film and the second amorphous oxide semiconductor film to form a channel layer. In embodiments of the present invention, for example, the first amorphous oxide semiconductor film and the second amorphous oxide semiconductor film have a thickness of 50~100 nm in total.

Step S203, forming a barrier layer on the substrate having been formed with the channel layer.

In embodiments of the present invention, for example, a layer of $SiO_2$ is deposited on the channel layer 4 and then is formed into a barrier layer 5 by utilizing a dry etching process, as shown in FIG. 3. Processes known in an existing technology can be used in this step, thus no further details will be given herein.

Step S204, forming a source electrode and a drain electrode on the substrate having been formed with the barrier layer.

In embodiments of the present invention, first of all, a first amorphous oxide film such as an IGZO film is deposited with a thickness of about 10~20 nm by utilizing, for example, magnetron sputtering. The IGZO film formed at this time has electrical characteristic between semiconductor and conductor, and can provide a good contact transition area with the channel layer 4, i.e., an area for transition from an amorphous metal oxide to a crystalline metal oxide.

Afterwards, the atmosphere for deposition is adjusted to contain Ar and $H_2$ (a ratio thereof is 3:2~1:1), and a second amorphous oxide (IGZO) film is subsequently deposited under such atmosphere. The IGZO film as formed by deposition at this time presents obvious conductor characteristics, thus can be used as a conductor electrode. Then the first amorphous oxide film and the second amorphous oxide film are patterned by utilizing an etching process to form a source electrode 6*a*' and a drain electrode 6*b*', as shown in FIG. 3. The first amorphous oxide film and the second amorphous oxide film have a thickness of 200~220 nm in total. Here, the preparation flow of an Oxide TFT has finished.

Herein, an amorphous oxide (IGZO) semiconductor film that is sensitive to water, air and the like is likely to be affected by the external environment to lose its semiconductor characteristic and presents an electrical characteristic of conductor. As a result, in embodiments of the present invention, the amorphous oxide (IGZO) semiconductor is formed into a source electrode and a drain electrode with high conductivity by introducing a large amount of $H_2$, so as to decrease the resistance at the interface, thereby avoiding the hysteresis phenomenon and improving the display quality of the display panel.

In embodiments of the present invention, the method further comprises a subsequent preparation flow for an array substrate, which, for example, includes steps as below.

Step S205, forming a passivation layer on the substrate having been formed with the source electrode and the drain electrode.

In embodiments of the present invention, a passivation layer 7 is further formed after forming the source electrode 6*a*' and the drain electrode 6*b*'. The process of forming the passivation layer 7 can include forming the passivation layer 7 by coating an acrylic resin material on the layer of the source and drain electrodes through a spin coating process, or, by depositing $SiO_2$ or $SiN_x$ on the layer of the source and drain electrode; and forming a via hole in a structure as shown in FIG. 3 in the passivation layer 7 by utilizing a dry etching process. The passivation layer 7 can well resist moistures from the external environment so as to reduce the influence experienced by carriers in the channel layer.

In embodiments of the present invention, the method further comprises steps as below.

Step S206, forming a pixel electrode on the substrate having been formed with the passivation layer.

Herein, it only needs to electrically connect the pixel electrode 8 with the drain electrode out of the drain and source electrodes to ensure the proper drive action of a pixel unit by the Oxide TFT through the pixel electrode 8. In embodiments of the present invention, for example, by utilizing magnetron sputtering, a transparent conductive material such as ITO can be deposited on the substrate having been formed with the passivation layer which is provided with the via hole; and the pixel electrode 8 can be formed by utilizing a wet etching process. The pixel electrode 8 is electrically connected with the drain electrode 6*b*' through the via hole in the passivation layer 7, as shown in FIG. 3. The pixel electrode can be formed by processes known in an existing technology, thus no details will be given herein.

It should be explained that the above-mentioned preparation method of the Oxide TFT is also applicable for use in an organic light-emitting diode (OLED) display. However, for an OLED display, the electrode formed by using ITO in the previously described step 206 is no longer a pixel electrode but an anode or a cathode of an organic light-emitting layer.

Hereafter a structure of the Oxide TFT prepared by utilizing the above-mentioned method is described.

The Oxide TFT in embodiments of the present invention can comprise a gate electrode, a gate insulating layer, a channel layer, a source electrode and a drain electrode; the source electrode and the drain electrode are formed by using an amorphous oxide material which presents a conductor characteristic. In embodiments of the present invention, for example, the amorphous oxide material is Indium Gallium Zinc Oxide (IGZO), although the present invention is not limited thereto.

As shown in FIG. 3, an Oxide TFT in the bottom-gate structure comprises a gate electrode 2 disposed on a substrate 1; a gate insulating layer 3 disposed on the gate electrode 2; a channel layer 4 disposed on the gate insulating layer 3; a barrier layer 5 dispose on the channel layer 4; and a source electrode 6*a*' and a drain electrode 6*b*' disposed above the gate insulating 3, the channel layer 4 and the barrier layer 5. In embodiments of the present invention, the source electrode 6*a*' and the drain electrode 6*b*' are formed by using an amorphous oxide material such as IGZO.

Figure 4:
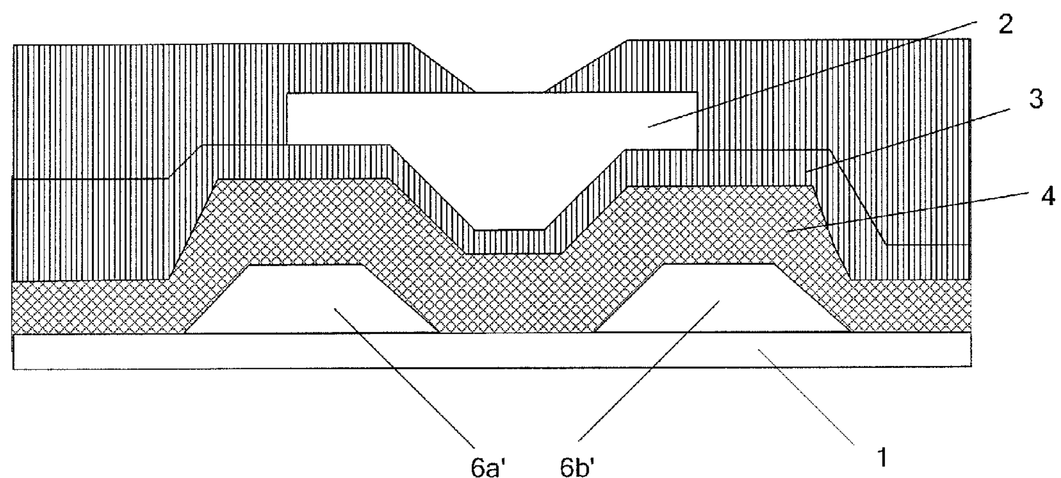
FIG. 4 is a schematic view illustrating another structure of an Oxide TFT as provided by an embodiment of the present invention.

Further, a structure of a top-gate Oxide TFT is shown in FIG. 4, comprising a substrate 1; a source electrode 6*a*' and a drain electrode 6*b*' that are disposed on the substrate 1; a channel layer 4 disposed on the substrate 1, the source electrode 6*a*' and the electrode drain 6*b*'; a gate insulating layer 3 disposed on the channel layer 4; and a gate electrode 2 disposed on the gate insulating layer 3. In embodiments of the present invention, the source electrode 6*a*' and the drain electrode 6*b*' are formed by using an amorphous oxide material such as IGZO.

Additionally, the embodiments of the present invention further provide an array substrate in which the Oxide TFT takes a form of the above-mentioned Oxide TFT. As shown in FIG. 3, the illustrated array substrate comprises the above-mentioned Oxide TFT; and also comprises a passivation layer 7 disposed on the barrier layer 5, the source electrode 6*a*', the drain electrode 6*b*' and the gate insulating layer 3; and further comprises a pixel electrode 8 disposed on the drain electrode 6*b*' and the passivation layer 7.

The structure as shown in FIG. 3 is illustrated with a TN (Twisted Nematic) type TFT array substrate by way of example. In addition to this, an array substrate comprising the above-mentioned Oxide TFT can also be of VA (Vertical Alignment) type, IPS (In-Plane Switch) type, or FFS or ADS (Advanced Dimension Switch) type.

Embodiments of the present invention further provide a display device comprising the above-mentioned array substrate.

It should be explained that the Oxide TFT, the array substrate, the display device, and the preparation method of Oxide TFT of the embodiments of the present invention are not only applicable for LCD devices but also other display devices such as OLED.

In embodiments of the present invention, the display device may be any product or component having display function, such as LC panel, electronic paper, OLED panel, mobile phone, tablet PC. TV, display, laptop, digital photo frame and navigator.

As above, with the Oxide TFT, the preparation method thereof, the array substrate and the display device as provided by the embodiments of the present invention, the defect state V[O] in an amorphous oxide semiconductor used as a channel layer is converted into the state [OH] by introducing a certain amount of $H_2$ under an atmosphere of Ar and $O_2$; that is, the gradual transition from a channel layer to a source electrode and a drain electrode, in other words, the gradual transition from a semiconductor to a conductor, occurs; thus the internal crystalline structure is in a better way and the possibility that the carriers are hindered become less. Therefore the hysteresis phenomenon resulted by the defects which capture the carriers in the channel layer can be mitigated.

Furthermore, by depositing an amorphous oxide film through introducing a large amount of $H_2$ under an atmosphere of Ar after forming a barrier layer, the amorphous oxide film will present the electrical characteristic of conductor and are formed into a source electrode and a drain electrode. Since the source electrode and the drain electrode are formed by using the same material as the channel layer, the interface between the source electrode, the drain electrode, and the channel layer has relatively low resistance and suffers less influence of the carriers in the channel layer, thus the hysteresis phenomenon is mitigated effectively, which improves the display quality of the display panel.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A preparation method of an Oxide TFT, comprising forming a gate electrode, a gate insulating layer, a channel layer as well as a source electrode and a drain electrode on a substrate, wherein the channel layer is formed by depositing an amorphous oxide semiconductor film in a first mixed gas containing $H_2$, Ar and $O_2$, wherein forming of the channel layer comprises:

depositing a first amorphous oxide semiconductor film having a thickness of 50-80 nm in a mixed gas of Ar and $O_2$;

subsequently depositing a second amorphous oxide semiconductor film having a thickness of 10-20 nm in a mixed gas of Ar and $H_2$, wherein during a transition period the mixed gas of Ar and $O_2$ is mixed with gases of Ar and $H_2$, so that a final mixed gas of Ar and $H_2$ containing only Ar and $H_2$ is obtained after depositing the second amorphous oxide semiconductor film; and conducting a patterning process on the first amorphous oxide semiconductor film and the second amorphous oxide semiconductor film to form the channel layer, in the mixed gas of Ar and $O_2$, Ar and $O_2$ are contained at a ratio of 15:1-20:1; in the mixed gas of Ar and $H_2$, Ar and $H_2$ are contained at a ratio of 9:1-2:1.

2. The preparation method according to claim 1, wherein the source electrode and the drain electrode are formed by depositing in a second mixed gas containing $H_2$ and Ar; the source electrode and the drain electrode are formed by using an amorphous oxide material which presents conductor characteristic.

3. The preparation method according to claim 1, wherein, in the mixed gas of Ar and $O_2$, Ar and $O_2$ are contained at a ratio of 19:1; in the mixed gas of Ar and $H_2$, Ar and $H_2$ are contained at a ratio of 9:1.

4. The preparation method according to claim 2, wherein forming of the source electrode and the drain electrode comprises:

depositing a first amorphous oxide film having a thickness of 10-20 nm in a mixed gas of Ar and $H_2$ which are contained at a ratio of 9:1-2:1;

subsequently depositing a second amorphous oxide film having a thickness of 180-200 nm in a mixed gas of Ar and $H_2$ which are contained at a ratio of 3:2-1:1; and conducting a patterning process on the first amorphous oxide film and the second amorphous oxide film to form the source and the drain.

5. The preparation method according to claim 4 wherein, when depositing the first amorphous oxide film, Ar and $H_2$ are contained at a ratio of 2:1.

6. The preparation method according to claim 1, wherein the amorphous oxide material is Indium Gallium Zinc Oxide (IGZO).

7. An array substrate, comprising an Oxide TFT according to claim 1.

8. A display device, comprising the array substrate according to claim 7.

9. The array substrate according to claim 7, wherein the amorphous oxide material is Indium Gallium Zinc Oxide (IGZO).

10. The preparation method according to claim 2, wherein the amorphous oxide material is Indium Gallium Zinc Oxide (IGZO).

11. The preparation method according to claim 1, wherein the amorphous oxide material is Indium Gallium Zinc Oxide (IGZO).

12. The preparation method according to claim 3, wherein the amorphous oxide material is Indium Gallium Zinc Oxide (IGZO).

13. The preparation method according to claim 4, wherein the amorphous oxide material is Indium Gallium Zinc Oxide (IGZO).

14. The preparation method according to claim 5, wherein the amorphous oxide material is Indium Gallium Zinc Oxide (IGZO).

15. A preparation method of an Oxide TFT, comprising forming a gate electrode, a gate insulating layer, a channel layer as well as a source electrode and a drain electrode on a substrate, wherein the channel layer is formed by depositing an amorphous oxide semiconductor film in a first mixed gas containing $H_2$, Ar and $O_2$, wherein forming of the channel layer comprises:

depositing a first amorphous oxide semiconductor film in a mixed gas of Ar and $O_2$;

subsequently depositing a second amorphous oxide semiconductor film in a mixed gas of Ar and $H_2$, wherein during a transition period the mixed gas of Ar and $O_2$ is mixed with gases of Ar and $H_2$, so that a final mixed gas of Ar and $H_2$ containing only Ar and $H_2$ is obtained after depositing the second amorphous oxide semiconductor film; and conducting a patterning process on the first amorphous oxide semiconductor film and the second amorphous oxide semiconductor film to form the channel layer.

* * * * *